(12) United States Patent
Iga et al.

(10) Patent No.: US 8,494,019 B2
(45) Date of Patent: Jul. 23, 2013

(54) MULTI-BEAM SEMICONDUCTOR LASER DEVICE

(75) Inventors: Yoshihiko Iga, Hitachinaka (JP); Hiroshi Moriya, Ushiku (JP); Yutaka Inoue, Komoro (JP); Hideki Hara, Saku (JP); Keiichi Miyauchi, Saku (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 12/750,838

(22) Filed: Mar. 31, 2010

(65) Prior Publication Data
US 2010/0254421 A1 Oct. 7, 2010

(30) Foreign Application Priority Data
Apr. 3, 2009 (JP) ................................. 2009-090716

(51) Int. Cl.
*H01S 5/00* (2006.01)

(52) U.S. Cl.
USPC .......... 372/50.12; 372/46.01; 372/43.01; 372/50.1; 372/36

(58) Field of Classification Search
USPC .............. 372/46.01, 50.12, 43.01, 50.1, 36
See application file for complete search history.

(56) References Cited

U.S. PATENT DOCUMENTS

| | | | | |
|---|---|---|---|---|
| 7,443,901 B2* | 10/2008 | Inoue et al. | ...................... | 372/87 |
| 2001/0026571 A1* | 10/2001 | Hayakawa | ....................... | 372/45 |
| 2002/0172245 A1* | 11/2002 | Nakatsuka et al. | .............. | 372/36 |
| 2008/0279246 A1 | 11/2008 | Nakatsuka et al. | | |
| 2008/0291960 A1* | 11/2008 | Inoue et al. | ................. | 372/45.01 |
| 2009/0041076 A1* | 2/2009 | Inoue et al. | ................. | 372/46.01 |
| 2009/0147816 A1* | 6/2009 | Iga et al. | ...................... | 372/50.12 |
| 2010/0046563 A1* | 2/2010 | Sato | ............................ | 372/38.05 |
| 2011/0116526 A1* | 5/2011 | Sorimachi et al. | ........ | 372/46.012 |

FOREIGN PATENT DOCUMENTS

| | | |
|---|---|---|
| JP | 2003-031905 | 1/2003 |
| JP | 2007-095736 | 4/2007 |
| JP | 2008-277471 | 11/2008 |

* cited by examiner

*Primary Examiner* — Jessica Stultz
*Assistant Examiner* — Delma R Forde
(74) *Attorney, Agent, or Firm* — Antonelli, Terry, Stout & Kraus, LLP.

(57) ABSTRACT

Within a semiconductor laser device, mounting a semiconductor laser element array of multi-beam structure on a sub-mount, the semiconductor laser element array of multi-beam structure comprises one piece of a semiconductor substrate 11; a common electrode 1, which is formed on a first surface of the semiconductor substrate; a semiconductor layer 2, which is formed on the other surface of the semiconductor substrate, and has a plural number of light emitting portions 7 within an inside thereof; a plural number of anode electrodes 3 of a second conductivity type, which are formed above the plural number of light emitting portions, respectively; and a supporting portion 25, which is provided outside a region of forming the light emitting portions, wherein on one surface of the sub-mount is connected an electrode 3 of the semiconductor laser element array through a solder 4, and that solder 4 is formed to cover a supporting portion and an electrode neighboring thereto, and further on the electrode 3 is formed a groove portion 9 between the supporting portion 25 neighboring and the light emitting portions 7.

18 Claims, 6 Drawing Sheets

US 8,494,019 B2

MULTI-BEAM SEMICONDUCTOR LASER DEVICE

This application relates to and claims priority from Japanese Patent Application No. 2009-090716 filed on Apr. 3, 2009, the entire disclosure of which is incorporated herein by reference.

BACKGROUND OF THE INVENTION

The present invention relates to a semiconductor laser device, and in particular, it relates to a multi-beam semiconductor laser device for generating plural numbers of laser beams therefrom.

Accompanying wide distribution of PPC (Plain Paper Copier), a requirement of high-speed in a printing speed increases for a laser printer, and in particular, a demand rises up, rapidly, for the multi-beam semiconductor laser device for generating plural numbers of laser beams therefrom. With such multi-beam semiconductor laser device, since it has light emitting portions, which are aligned in one-dimensional or two-dimensional manner, a number of scanning beams can be increased, and thereby having an advantage of enabling a high-speed printing.

By the way, in the general structure of such multi-beam semiconductor laser device, as is already known in the following Patent Document 1, for example, a plural number of laser elements are formed on a semiconductor substrate, while providing a region (e.g., a groove) for separation, between the laser elements, for each; thereby forming the light emitting portions, which are aligned in one-dimensional or two-dimensional manner. However, according to this Patent Document 1, for the purpose of obtaining multi-beam semiconductor laser, being uniform in the characteristics thereof, such as, wavelength of emission light, a luminous efficiency, an output for each laser element, etc., there is disclosed that the laser elements, which are formed in an outside region of the substrate, are used as dummy laser elements (i.e., supporting portions), which do not emit the lights when being used.

Also, with such multi-beam semiconductor laser device as was mentioned above, since the amount of heat generation in the laser devise goes up accompanying with an increase of a number of light emitting points on one (1) piece of the semiconductor substrate, it is necessary to improve heat radiation efficiency thereof. However, in the following Patent Document 2, there is provided the structure of a semiconductor laser device having laser elements emitting the laser lights having different wavelengths, wherein, in particular for achieving an improvement of the heat radiation efficiency thereof, a light emitting point of the laser elements, emitting a laser light having the shortest wavelength, is substantially positioned on a center line of the substrate when seeing it in a direction parallel with a main surface of that substrate, within a surface perpendicular to an optical axis of that laser element.

In addition thereto, with such multi-beam semiconductor laser device as was mentioned above, because of the requirements of suppressing relative differences of the beam characteristics from each laser element, such as, a wavelength, a polarizing angle, a luminous efficiency, an optical output, etc., for example, therefore it is an important problem to be dissolved; e.g., reducing thermal stress when being mounted, and thereby lowering the relative difference of strain applied onto the light emitting portions. However, with the well-known prior documents, it is already known that the polarization direction of a beam rotates in proportion to the shear strain generating within a semiconductor layer, according to the following Non-Patent Document 1.

PRIOR ART DOCUMENTS

Patent Documents

[Patent Document 1] Japanese Patent Laying-Open No. Hei 07-202323 (1995); and
[Patent Document 2] Japanese Patent Laying-Open No. 2007-35854 (2007).

Non-Patent Documents

[Non-Patent Document] M. A. Fritz, IEEE Trans. Comp. Package. Technol., 27 (2004) p 147.

BRIEF SUMMARY OF THE INVENTION

As is apparent from the above, with the multi-beam semiconductor laser device, it is required to equalize the characteristics of the beam emitting from each of the laser elements, which are formed on one (1) piece of the semiconductor substrate, and also to improve the heat radiation efficiency thereof. However, with the conventional arts mentioned above, it is insufficient to satisfy such requirements.

Thus, according to the present invention, by taking the conventional arts mentioned above into the consideration thereof, an object thereof is to provide a multi-beam semiconductor laser device, improved with the heat radiation efficiency thereof, as well as, in particular, reducing the thermal stress, which is generated after mounting, and also reducing the relative difference of strain, which is applied onto the light emitting portions, thereby enabling to equalize the characteristics of the beam emitting from each laser element.

For accomplishing the object mentioned above, according to the present invention, there is provided a semiconductor laser device, mounting a semiconductor laser element array of multi-beam structure on a sub-mount, said semiconductor laser element array of multi-beam structure comprising: one piece of a semiconductor substrate; a cathode electrode of a first conductivity type, which is formed on a first surface of said semiconductor substrate; a semiconductor layer, which is formed on a second surface of said semiconductor substrate, and has a plural number of light emitting portions within an inside thereof; a plural number of anode electrodes of a second conductivity type, which are formed above said plural number of light emitting portions, respectively; and a supporting portion, which is provided outside of a region where said plural number of light emitting portions are formed, and further on one surface of said sub-mount are connected said anode electrodes of the second conductivity type of said semiconductor laser element array, respectively, through a jointing material, wherein said jointing member is made of a high heat conductivity material, and said jointing member is formed to cover said supporting portion and said anode electrode of the second conductivity type neighboring thereto, and further on said anode electrodes of the second conductivity type is formed a groove portion between said supporting portion neighboring thereto and said light emitting portion.

Also, according to the present invention, within the semiconductor laser device, as described in the above, it is preferable that an area of said anode electrode of the second conductivity type, which is formed above said light emitting portions is larger than a joint area between said anode electrodes of the second conductivity type and said jointing member, and further that a ratio of said joint area with respect to the area of said electrode between said anode electrodes of the second conductivity type and said joint member (joint area/electrode area) is 0.8 to 0.4, and for that purpose, it is also preferable that an end portion of said joint member, which is connected with said anode electrodes of the second conductivity type, is in a convex/concave configuration.

Further, according to the present invention, also for accomplishing the object mentioned above, within the semiconductor laser device, as described in the above, wherein said semiconductor layer has an even number of light emitting portions, which are disposed in one-dimensional manner within an inside thereof, and on said anode electrodes of the second conductivity type is formed a groove portion also between the light emitting portions neighboring to each other, as well as forming said groove portion between said supporting portion neighboring and said light emitting portion. In addition thereto, according to the present invention, within the semiconductor laser device as described in the above, it is preferable that further anode electrodes are formed, respectively, corresponding to a half number of light emitting portions among said even number of pieces of light emitting portions, in a central portion thereof, which are disposed in the one-dimensional manner, said joint member is formed independently on upper surfaces of said half number of said even number of pieces of anode electrodes, respectively, and an area of said anode electrodes of the second conductivity type, which are formed on upper surfaces of said light emitting portions, is larger than the joint area between said anode electrodes of the second conductivity type and said joint member.

According to the present invention mentioned above, there can be obtained an effect, being superior in the practical use thereof, that there is provided the multi-beam semiconductor laser device for enabling an improvement of the heat radiation efficiency thereof, as well as, in particular, reducing the thermal stress generated after mounting, and reducing a relative difference of strains applied onto the light emitting portions, and thereby enabling equalization of characteristics of a beam emitting from each laser element.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE PREFERRED EMBODIMENTS

Hereinafter, embodiments according to the present invention will be fully explained by referring to the attached drawings.

Embodiment 1

Figure 1:
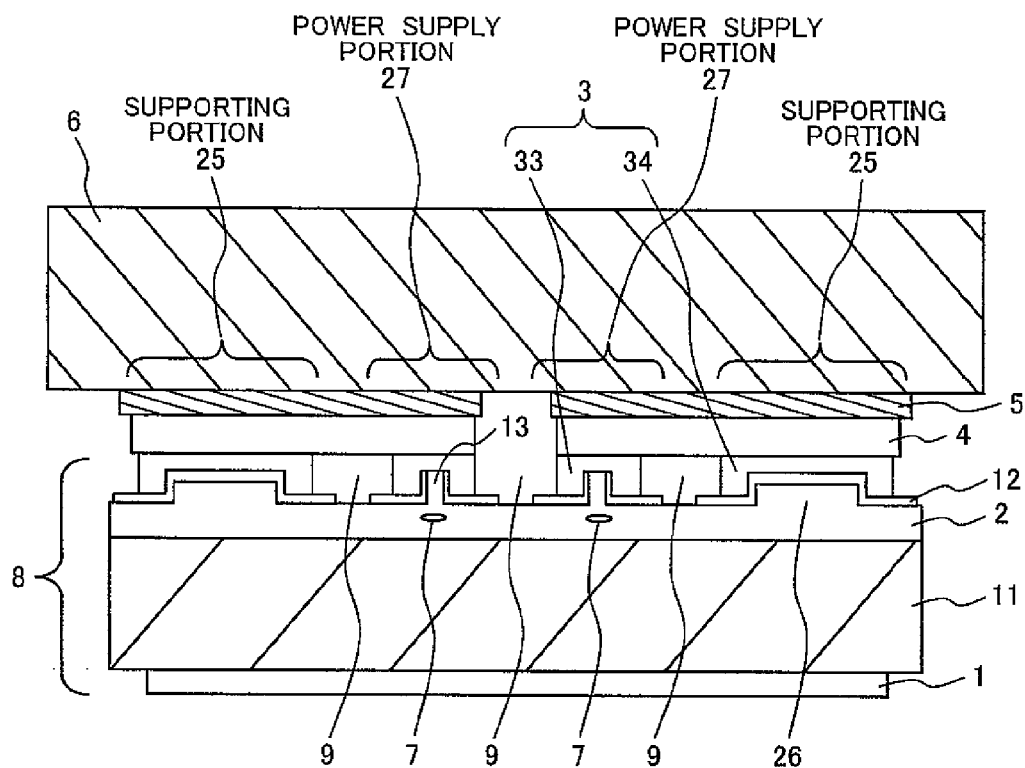
FIG. 1 is a cross-section view for showing the interior structure of a multi-beam semiconductor laser device, according to an embodiment (an embodiment 1) of the present invention.

FIG. 1 attached herewith is a cross-section view for showing an interior structure of a multi-beam semiconductor laser device, according to a first embodiment (e.g., an embodiment 1) of the present invention, and herein is shown so-called a cross-section structure of the semiconductor laser device of two (2) beams structure, forming two (2) pieces of semiconductor laser elements in one-dimensional manner, as an example. As is shown in this FIG. 1, the semiconductor device comprises a semiconductor substrate (hereinafter, being called, a "substrate", simply) 11, a semiconductor layer 2, being formed on one of the surfaces (e.g., an upper surface, in the present example) of the substrate 11 mentioned above and having array-like light emitting portions 7 within an inside thereof, a common electrode 1, being formed on the other surface (e.g., a lower surface, in the present example), and a semiconductor laser element array (e.g., the laser chip) 8, being formed on the surface of the semiconductor layer 2 through an insulation layer 12 and having an independent electrode 3, which is separated in a stripe-manner, and which includes electrodes 33 and 34, as shown in FIG. 1. And, the semiconductor laser element array (e.g., the laser chip) 8 is jointed on a stripe-like sub-mount electrode 5 formed on a sub-mount 6, through a solder (layer) 4, for example.

However, though not shown in the figure herein, the sub-mount 6 is further jointed with a heat sink made of cupper (Cu), for example, through a solder or the like. This sub-mount 6 achieves roles of relieving or moderating thermal stress due to the difference of coefficient of linear expansion between the heat sink and the semiconductor laser element array 8, and also of improving the heat radiation efficiency thereof. For this reason, as a material of the sub-mount 6, preferably, it is preferable to use a material having a high thermal conductivity and a coefficient of linear expansion near to that of the substrate 11 mentioned above, for example, SiC, Si, CuW, or AlN, etc.

Figure 2:
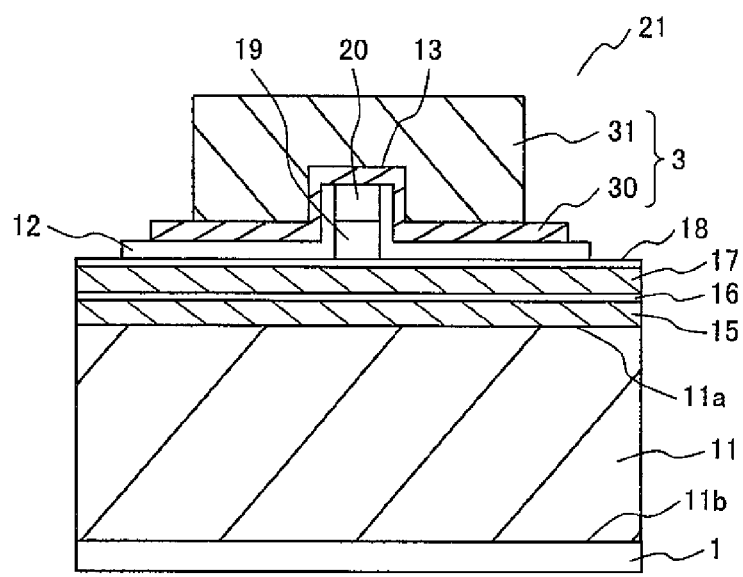
FIG. 2 is an enlarged cross-section view of a part, for showing the multi-beam semiconductor laser device mentioned above; in particular, the detailed structure of semiconductor layers thereof.

Herein, explanation will be given, below, of the details of the semiconductor layer 2, by referring to FIG. 2 attached herewith. This FIG. 2 is an enlarged cross-section view of a part, for showing a region of one (1) piece of the semiconductor laser element array 8.

Each semiconductor laser element 21 comprises the substrate (n-GaAs substrate) 11 of a first conduction type (for example, a "n" type), which is made of GaAs and has a first surface 11a and also a second surface 11b, as a surface opposite to that surface, and on that first surface is formed the semiconductor layer 2. This semiconductor layer 2 is built up with an "n"-type clad layer 15, an active layer 16 having a multi-quantum well structure, a "p"-type first clad layer 17, a "p"-type etching stop layer 18, a "p"-type second clad layer 19 and a "p"-type contact layer 20, which are sequentially piled up in the direction perpendicular to the first surface mentioned above.

Herein is shown an example of the materials and thicknesses of the semiconductor layer 2 mentioned above. The "n"-type clad layer 15 is made of AlGaInP layer having thickness of 2.0 μm. The active layer 16 is made of AlGaInP layer having a barrier layer of 5 nm thickness, and the well layer is made of GaInP layer having thickness of 6 nm, and thereby building up, so-called, the multi-quantum well structure. Any one of the "p"-type first clad layer 17, the "p"-type etching stop layer 18, and the "p"-type second clad layer 19 is made up with AlGaInP layer. The "p"-type first clad layer 17 has thickness of 0.3 μm, the "p"-type etching stop layer 18 has thickness of 20 nm, and the "p"-type second clad layer 19 has thickness of 1.2 μm, respectively. And, the "p"-type contact layer 20 is made of GaAs having thickness of 0.4 μm.

Further, titles or names of parts of the semiconductor layer 2 will be also called as below, indicative of the conductivity type and the material thereof. Thus, the "n"-type clad layer 15 is called "n-AlGaInP clad layer", the "p"-type first clad layer 17 is "p-AlGaInP first clad layer", the "p"-type second clad layer 19 is "p-AlGaInP second clad layer", and the "p"-type contact layer 20 is "p-GaAs contact layer", respectively.

On a first surface side of the n-GaAs substrate 11 is formed an insulation layer 12, excepting for a surface (e.g., an upper surface) of a ridge portion 13. This insulation layer 12 is made up with a layer of silicon dioxide, for example.

On an upper portion of the ridge portion 13 mentioned above, and on an upper portion of the insulation layer 12 is formed the independent electrode 3, and this independent electrode 3 is made up with two (2) layers, i.e., a first conductor portion 30 and a second conductor portion 31. A part of the first conductor portion 30 is connected with the p-GaAs contact layer 20 of the ridge portion 13. Also, as is shown in the figure, end portions of the first conductor portion 30 and the second conductor portion 31 are ended or terminated on the insulation layer 12, so as not to reach to both side edges of the n-GaAs substrate 11. Thus, the independent electrode 3 builds up an independent electrode (including the conductor portions 30 and 31), being separated on the insulation layer 12, and therefore it is possible to apply voltage, separately, on the ridge portion 13 of each semiconductor laser element 21. The first conductor portion 30 is made up with a multi-layer of piling up metals, for example, Ti, Pt and Au, one by one, sequentially, and thickness of the entire thereof is 0.5 μm. The second conductor portion 31 is made of Au or the like, for example, and is formed to be thick, such as, from 3 μm to 7 μm, for example, and the surface (the upper surface) thereof is flattened. On the other hand, on the second surface of the n-GaAs substrate 11 is formed a common electrode 1. Also, the common electrode 1 is made up with a metal multi-layer piling up, Ti, Pt and Au, sequentially, for example, and thickness of the entire is 0.5 μm.

Herein, turning back to FIG. 1, again, as is shown in the figure, the semiconductor laser element array (the laser chip) 8 has the structure of piling up the semiconductor layer 2 having two (2) pieces of the convex ridges 13, on the substrate 11, on which the common electrode (i.e., a cathode electrode) 1, and the light emitting portions within the semiconductor layer 2 are aligned at an equal distance between them, in one-dimensional manner. Further, on an outside of each of those ridge portions is formed a terrace portion 26. The ridge portion 13 and the terrace portion 26 are disposed to be symmetric on both sides with respect to a central position of the substrate 11, and further they extend in a direction of a resonator not shown in the figure.

Upon both side surfaces of the ridge portion 13 and in the vicinity thereof, the insulation layer 12 is formed on the semiconductor layer 2, and further on an upper portion of the insulation layer 12 is so formed the independent electrode (i.e., an anode electrode) 3 that it contacts with the upper surface of the ridge portion 13. With this, the ridge portion 13 makes up a power supply portion (thus, a heat generating portion) 27, into which current is strangulated and supplied. On the other hand, on an upper surface and both side surfaces of the terrace portion 26, and further on the semiconductor layer 2 in the vicinity thereof is formed the insulation layer 12, and on an upper surface thereof is formed the independent electrode 3, in the similar manner to the ridge portion 13. In this manner, the terrace portion 26 as a whole thereof is covered with the insulation layer 12, and for that reason, no current flows within the semiconductor layer 2 below the terrace portion 26 (i.e., a non-heat generating portion generating no heat therefrom), and with this, building up a supporting portion 25 of the semiconductor laser element array (i.e., the laser chip).

Further, on a lower surface of the sub-mount 6 is so formed the sub-mount electrode 5 that it faces to the independent electrode 3, and the sub-mount electrode 5 and the independent electrode 3 are connected with each other, with using a solder 4 having a high thermal conductivity, such as, Au—Sn, etc. Further, though illustration thereof will be omitted herein, upon an upper surface of the sub-mount 6 is jointed the heat sink made of Cu with a solder.

By the way, the semiconductor laser element array (the laser chip) 8 is jointed on the sub-mount 6, as was mentioned above, through the solder 4 of Au—Sn, etc., under temperature from 200° C. to 300° C. when it is mounted. After this solder joint, when temperature goes down to the room temperature, if the coefficient of linear expansion of the sub-mount 6 is smaller than that of the substrate 11, since the sub-mount 6 is harder to shrink (i.e., the coefficient of linear expansion is smaller) than the substrate 11, the semiconductor layer 2 is pulled outside in the horizontal direction, on the side of the independent electrode 3 near to the sub-mount 6 (i.e., an upper surface side in the figure), but the semiconductor layer 2 is compressed inside in the horizontal direction on the side of the common electrode 1 (see FIG. 3 attached). Herein, the horizontal direction means a direction parallel with the junction surface between the semiconductor layer 2 and the substrate 11, while the vertical direction is defined to be that perpendicular to the junction surface between the semiconductor layer 2 and the substrate 11, i.e., the direction perpendicular to that of a resonator of the semiconductor laser element array 8.

Figure 3:
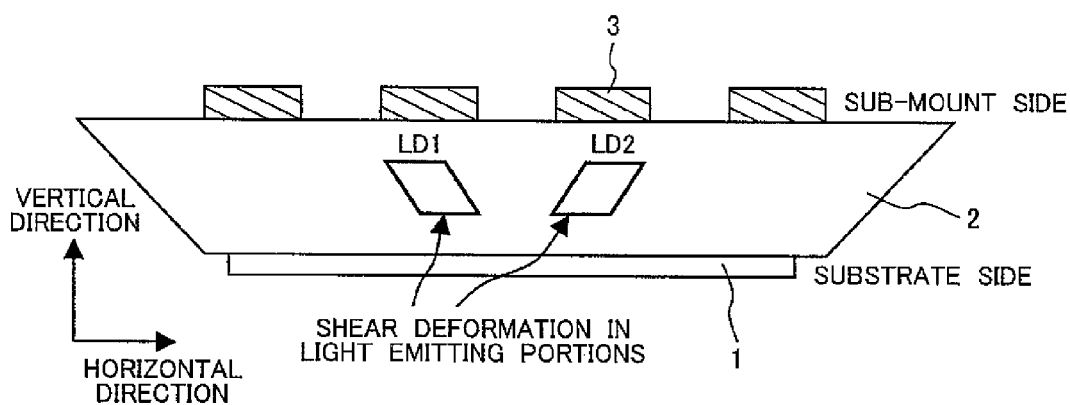
FIG. 3 is a diagram for explaining the shear deformation of light emitting portions within a laser chip after being mounted.

Herein, explaining the strain generating within the semiconductor laser element array (the laser chip) 8 in details thereof, after being mounted as was mentioned above, a parallelogram shown by oblique lines (or, check-patterned) in FIG. 3 shows a state of shear deformation within the light emitting portion 7. The strain within this light emitting portion 7, i.e., the horizontal shear strain after the solder joint is different from, for each light emitting portion 7, in magnitude and sign thereof, and thereby generating a relative difference of the shear strain. However, in case where the coefficient of linear expansion of the substrate 11 is smaller than that of the sub-mount 6, the sign of the shear strain is reversed in the light emitting portion 7. In this manner, after the solder joint in the mounting, since different shear strain is applied on each light emitting portion 7, a polarizing angle differs from for each beam, and this generates a relative difference of the polarizing angle, within the multi-beam semiconductor laser device.

Then, according to the present invention, as is shown by a reference numeral 9 in FIG. 1 mentioned above, so-called a groove is formed in a part of the independent electrode (the anode electrode) 3, an upper surface of which is covered with the solder 4, in particular, between an area or region where the light emitting portion 7 is formed (hereinafter, "a light emitting portion region") and an area or region where the supporting portion 25 is formed (hereinafter, "a supporting portion region"), and thereby reducing the shear stress, which is generated within each semiconductor laser element 21 after mounting the semiconductor laser element array (the laser chip) 8 on the sub-mount 6, and also improving the heat radiation efficiency thereof. Hereinafter, explanation will be given on the function thereof.

Thus, with such structure of the semiconductor laser element array (the laser chip) 8 as was mentioned above, after being mounted on the lower surface of the sub-mount 6, since the solder layer 4 is formed covering over upper surfaces of the light emitting portion region and the supporting portion region of the electrode 3 mentioned above, heats generating from the light emitting portion 7, as a heat generating portion, are transferred to the sub-mount 6, passing through the electrode 3 on the upper surface thereof and the solder layer 4 mentioned above, and further through the sub-mount electrode 5; however, in that instance, they are transferred, widely, into a lower surface of the sub-mount 6 through the solder layer 4 covering also the surface of the terrace portion 26, i.e., non heat-generating portion, therefore the heat radiating efficiency thereof can be improved. On the other hand, since the shear stress, generating within each semiconductor laser element 21 after mounting the semiconductor laser element array (the laser chip) 8 on the sub-mount 6, can be reduced by means of the groove 9 formed between the light emitting portion region and the supporting portion region mentioned above, then it is possible to equalize the characteristics of the beam emitting from each laser element formed on one (1) piece of the substrate.

Embodiment 2

Figure 4:
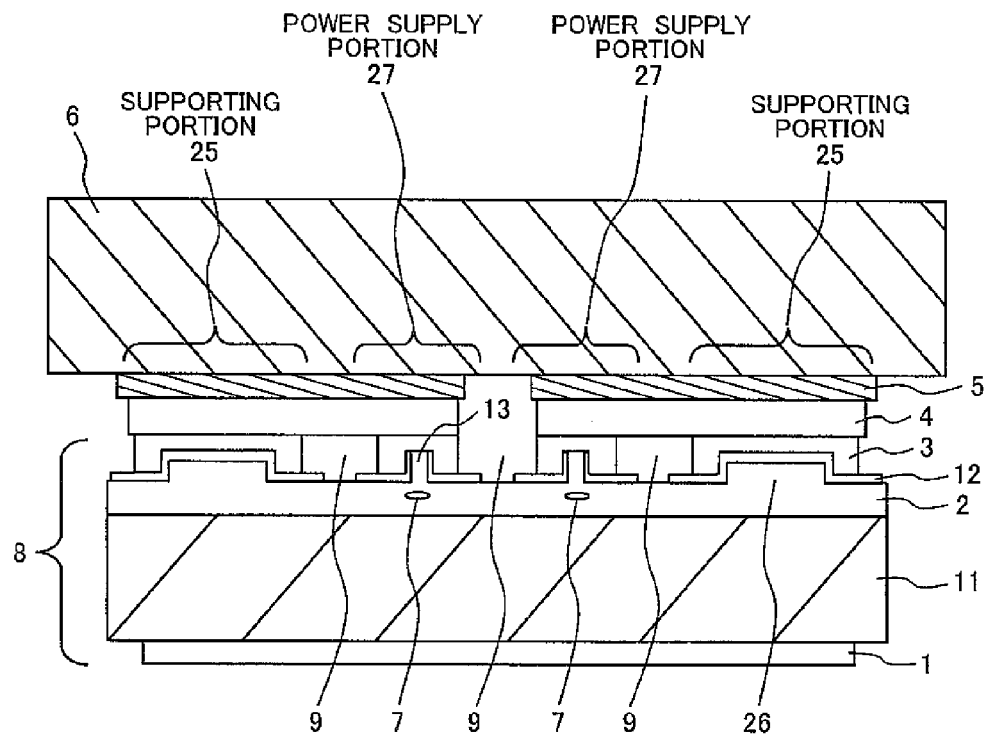
FIG. 4 is a cross-section view for showing the interior structure of a multi-beam semiconductor laser device, according to a second embodiment (an embodiment 2) of the present invention.
Figure 5A:
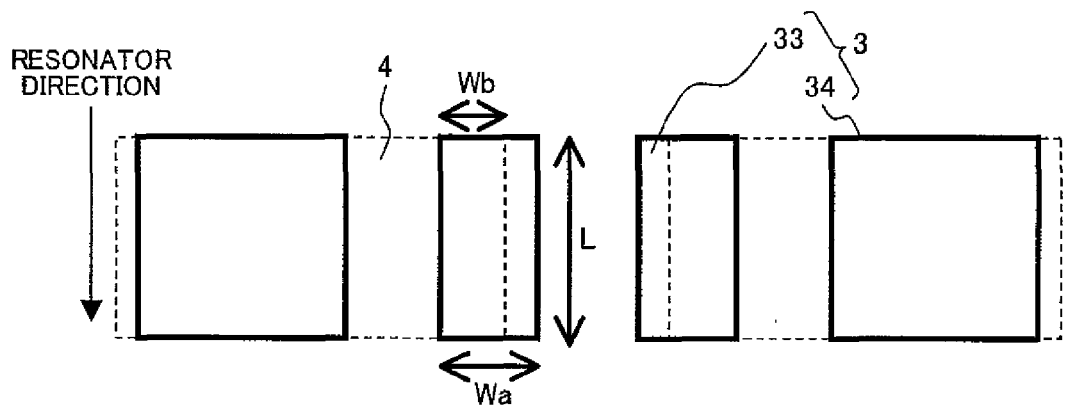
FIGS. 5A and 5B are upper views of the multi-beam semiconductor laser device, according to that of the embodiment 2, in particular, of semiconductor laser element arrays (e.g., a laser chip)
Figure 5B:
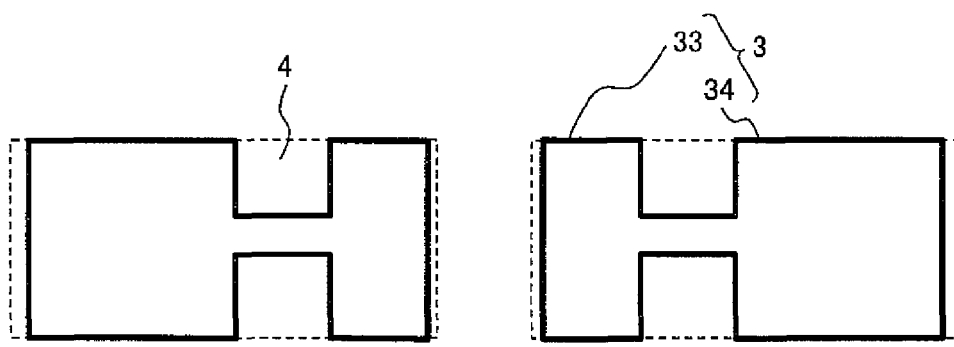

Next, explanation will be given on the structure of a multi-beam semiconductor laser device, according to a second embodiment (an embodiment 2) of the present invention, by referring to FIGS. 4 and 5A and 5B. Moreover, FIG. 4 is a cross-section view of the multi-beam semiconductor laser device according to the embodiment 2, and FIGS. 5A and 5B show upper views of the semiconductor laser element array (the laser chip) 8. However, in those figures, the elements same to those of the embodiment 1 are also attached with the same reference numerals, and the explanation thereof will be omitted herein, for the purpose of avoiding repetition thereof.

With the multi-beam semiconductor laser device, cross-section view of which is shown in FIG. 4, as is apparent from FIG. 5A attached herewith, has the interior structure being basically same to that of the embodiment 1 mentioned above. However, comparing to the embodiment 1 mentioned above, the solder layer 4 is formed on the surface of the sub-mount electrode 5, which is formed on a lower surface of the sub-mount 6, extending between the light emitting portion region where the light emitting portion 7 of the semiconductor laser element array (the laser chip) 8 is formed and the supporting portion region where the supporting portion 25 is formed. Further, a junction area with the light emitting portion region where the light emitting portion 7 is formed to be smaller than an area of the light emitting portion region. In more details thereof, in the present embodiment, when assuming that width of an electrode 33 of the light emitting portion 7 is "Wa", that junction width of the solder layer 4 jointing with the electrode of that light emitting portion is "Wb", and length of the solder layer 4 in the direction of the resonator is "L", respectively, then an area of the electrode is Wa×L, and the junction area between the electrode and the solder layer is Wb×L, and this has a joint structure between the electrode and the solder layer, satisfying Wb<Wa (in area: Wb×L<Wa×L). Also, FIG. 5B shows the structure, in which an anode electrode of a second conductivity type is partially connected between the supporting portion and the light emitting portion, and with this configuration, it is possible to make a chip selection.

Figure 6:
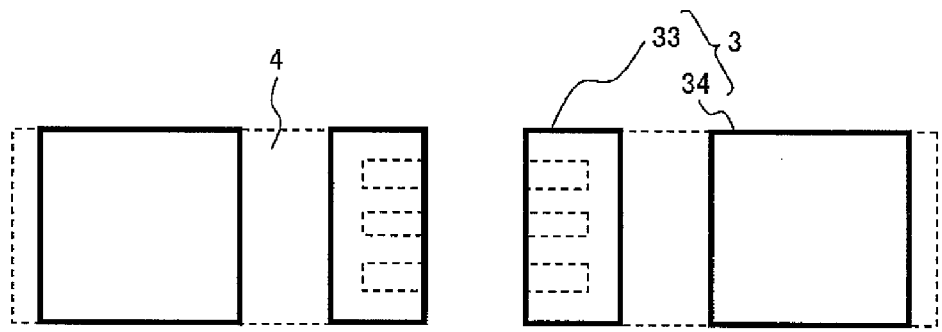
FIG. 6 is an upper view for showing the semiconductor laser element arrays (e.g., the laser chip), for showing an example of connecting structure between an electrode and a solder, within the multi-beam semiconductor laser device according to the embodiment 2.

Or alternatively, as the joint structure between the electrode and the solder satisfying Wb<Wa mentioned above, other than such structure mentioned as was mentioned above, a junction portion may be formed a zigzag (convex/concave) between the solder layer 4 and the electrode 31, as is shown in FIG. 6, for example, or although illustration thereof is not shown, width "L" in direction of the resonator may be narrowed.

However, in the embodiment mentioned above, the explanation was given on the present invention, being applied into so-called the multi-beam semiconductor laser device having two (2) beams, within which two (2) pieces of semiconductor laser elements are formed in the one-dimensional manner, as the one example thereof; to however, the present invention should not be limited to this, and further it can be applied into that forming two (2) or more pieces of semiconductor laser elements therein, and explanation thereof will be given hereinafter.

Embodiment 3

Figure 7:
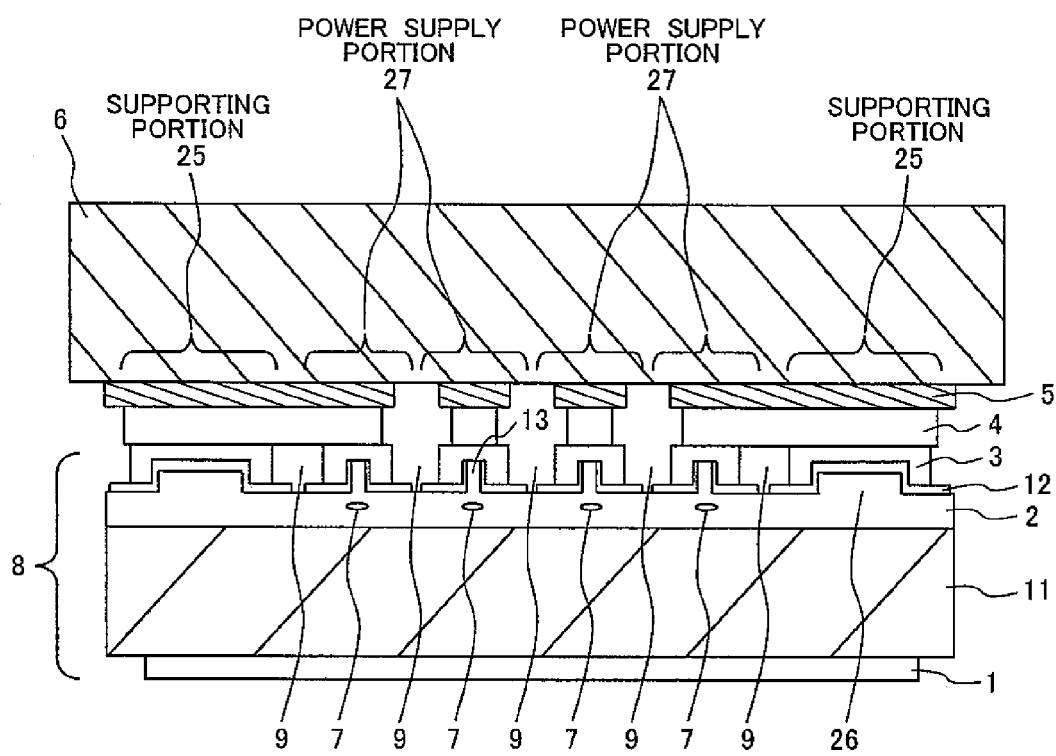
FIG. 7 is a cross-section view for showing the interior structure of a multi-beam semiconductor laser device, according to a third embodiment (an embodiment 3) of the present invention.

FIG. 7 attached herewith is a cross-section view for showing the interior structure of a multi-beam semiconductor laser device, according to a third embodiment (an embodiment 3) of the present invention, and as is apparent from this figure, the multi-beam semiconductor laser device according to this embodiment 3 is that applying the present invention into so-called the multi-beam semiconductor laser device of four (4) beams, forming four (4) pieces of semiconductor laser elements in the one-dimensional manner. However, in this figure, the elements same to those of the embodiments 1 and 2 are also attached with the same reference numerals, and the explanation thereof will be omitted herein, for the purpose of avoiding repetition thereof.

As is apparent from FIG. 7, within the multi-beam semiconductor laser device according to this embodiment 3, four (4) pieces of semiconductor elements (the light emitting portions 7) are formed within the semiconductor layer 2 thereof, and further the electrode 3 formed on the upper surface thereof is divided or separated by the groove portion 9, respectively, in the similar manner to that mentioned above. Thus, the light emitting portion region is separated by means of the groove portion 9, respectively, and also further the light emitting portion region on an outside thereof is also separated from the supporting portion region by the groove portion 9, respectively. Thus, such structure, in the similar manner to that of the embodiments mentioned above, can improve the heat radiating efficiency of the heat from the light emitting portion 7 as the heat generating portion can be improved, and also reduce the shear stress generating within each semiconductor laser element 21, and therefore it is possible to equalize the characteristics of a beam emitting from each of the laser elements formed on one (1) piece of substrate.

Further, in the embodiment 3 mentioned above, the solder layers 4 formed on two (2) pieces of light emitting portions 7 on an outside thereof, among those four (4) pieces of light emitting portions 7, are similar to those of the embodiment 1 or 2; however, the solder layers 4 on two (2) pieces of the light emitting portions at a central portion thereof are independently formed, respectively, and with this, it is possible to drive the four (4) pieces of the semiconductor elements, independently.

Figure 8A:
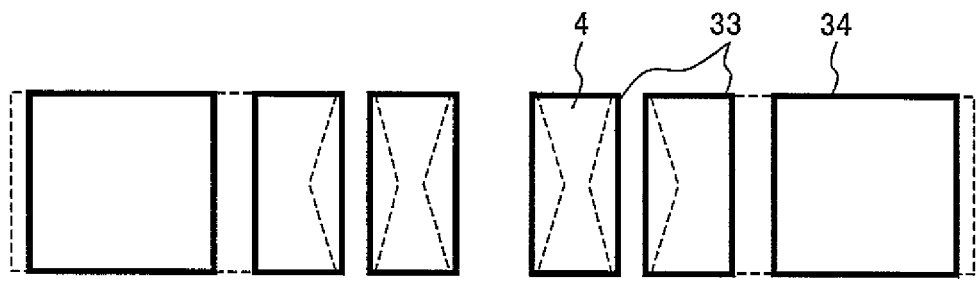
FIGS. 8A through 8C are upper views for showing the semiconductor laser element arrays (e.g., the laser chip), for showing an example of connecting structure between an electrode and a solder, within the multi-beam semiconductor laser device according to the embodiment 3.
Figure 8B:
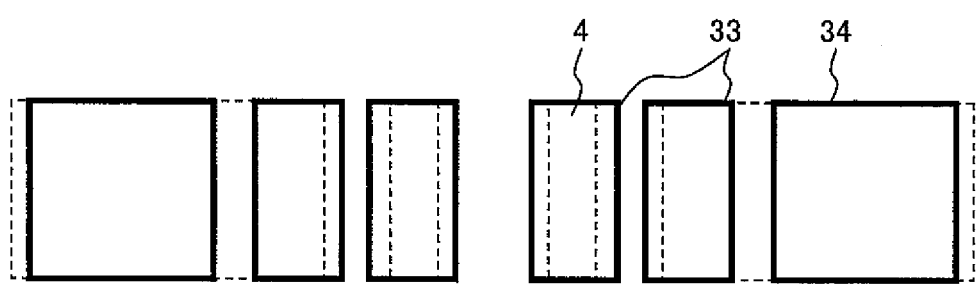
Figure 8C:
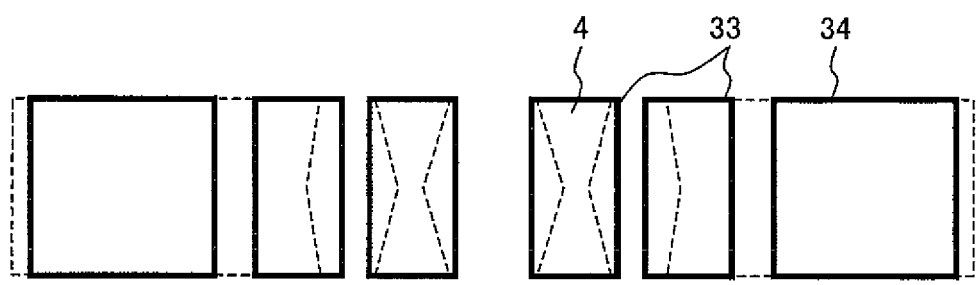

In addition thereto, with this embodiment 3, as is shown in FIGS. 8A to 8C attached herewith, the junction area between the solder layer 4 and the electrode 3, which are formed on the surface of the sub-mount electrode 5, which is formed on the lower surface of the sub-mount 6 is made smaller than the surface area of the electrode 3 of the light emitting portion 7 mentioned above (i.e., a power supply region), and with this, similar to that of the embodiment 2 mentioned above, there can be obtained the structure having an effect of reducing the shear strain further.

Figure 9:
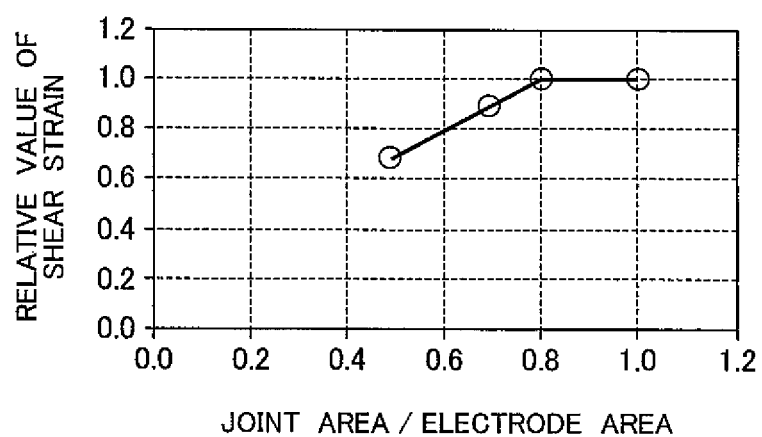
FIG. 9 is a view for showing a characteristics view (e.g., a graph) for showing an effect when applying such joining structure between the electrode and the solder, as shown in the embodiment 3 mentioned above.

Further, FIG. 9 attached herewith shows a characteristic view (e.g., a graph) for showing an effect obtainable when applying the joint structure of the electrode and the solder satisfying Wb<Wa therein, and this graph shows the shear strain within the light emitting portion after mounting, from applying an analysis of thermal stress with using the finite-element method, upon the multi-beam semiconductor laser device of four (4) beams shown in the above. An analysis with using the finite-element method is conducted by taking a film stacking process described in the known prior document (Japan Society Of Mechanical Engineers Papers ("A" edition), 55, 515, 1652-1656. (1989).

In this FIG. 9, the horizontal axis indicates a ratio of joint area of the solder 4 with respect to the electrode area, i.e., the area of the electrode 31 (joint area/electrode area), while the vertical axis thereof a relative value of the shear strain within the light emitting portion 7 after mounting, upon basis of the shear strain when Wb=Wa (joint area/electrode area=1). From this FIG. 9, when Wb/Wa is about 4/5=0.8 or lower than that, the relative value of the shear strain comes to be smaller than "1"; it can be seen that there can appear an effect of reducing the shear strain. Also, because the heat radiating efficiency go down if Wb/Wa becomes too small, it can be seen that a lower limit of Wb/Wa is preferable to be about 0.4.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A semiconductor laser device, mounting a semiconductor laser element array of multi-beam structure on a sub-mount,
said semiconductor laser element array of multi-beam structure comprising:
a semiconductor substrate;
a cathode electrode of a first conductivity type, which is formed on a first surface of said semiconductor substrate;
a semiconductor layer, which is formed on a second surface of said semiconductor substrate, and which includes a plural number of light emitting portions within an inside thereof;
a plural number of anode electrodes of a second conductivity type, which are formed above said plural number of light emitting portions, respectively; and
a supporting portion, which is provided spaced away from and outside of a region where said plural number of light emitting portions are formed, and further on one surface of said sub-mount are connected said anode electrodes of the second conductivity type of said semiconductor laser element array, respectively, through a jointing member, wherein said supporting portion does not include a light emitting portion,
wherein said jointing member is comprised of a high thermal conductivity material, and said jointing member is formed as one piece to cover both said supporting portion and at least one of said anode electrodes of the second conductivity type neighboring thereto, and further on said anode electrodes of the second conductivity type is formed a groove portion located between said supporting portion neighboring thereto and said light emitting portion and configured to reduce shear stress generated within the light emitting portion, and
further comprising an insulating film formed to cover an entire upper surface of the supporting portion to prevent current flow through the supporting portion.

2. The semiconductor laser device, as described in the claim 1,
wherein an area of said anode electrode of the second conductivity type, which is formed above said light emitting portions is larger than a joint area between said anode electrodes of the second conductivity type and said jointing member.

3. The semiconductor laser device, as described in the claim 2, wherein a ratio of said joint area with respect to the area of said electrode between said anode electrodes of the second conductivity type and said joint member (joint area/electrode area) is 0.8 to 0.4.

4. The semiconductor laser device, as described in the claim 3, wherein an end portion of said joint member, which is connected with said anode electrodes of the second conductivity type, is in a convex/concave configuration.

5. The semiconductor laser device, as described in the claim 1, wherein said semiconductor layer has an even number of light emitting portions, which are disposed in one-dimensional manner within an inside thereof, and
on said anode electrodes of the second conductivity type is formed a groove portion also between the light emitting portions neighboring to each other, as well as forming said groove portion between said supporting portion neighboring and said light emitting portion.

6. The semiconductor laser device according to claim 1, wherein said substrate is comprised of one piece.

7. A semiconductor laser device, mounting a semiconductor laser element array of multi-beam structure on a sub-mount,
said semiconductor laser element array of multi-beam structure comprising:
a semiconductor substrate;

a cathode electrode of a first conductivity type, which is formed on a first surface of said semiconductor substrate;

a semiconductor layer, which is formed on a second surface of said semiconductor substrate, and which includes a plural number of light emitting portions within an inside thereof;

a plural number of anode electrodes of a second conductivity type, which are formed above said plural number of light emitting portions, respectively; and a supporting portion, which is provided outside of a region where said plural number of light emitting portions are formed, and further on one surface of said sub-mount are connected said anode electrodes of the second conductivity type of said semiconductor laser element array, respectively, through a jointing member, wherein said jointing member is comprised of a high thermal conductivity material, and said jointing member is formed as one piece to cover both said supporting portion and at least one of said anode electrodes of the second conductivity type neighboring thereto, and further on said anode electrodes of the second conductivity type is formed a groove portion between said supporting portion neighboring thereto and said light emitting portion and configured, and further comprising an insulating film formed to cover an entire upper surface of the supporting portion to prevent current flow through the supporting portion, wherein an area of at least one of said anode electrodes of the second conductivity type, which is formed above said light emitting portions is larger than a joint area between said anode electrodes of the second conductivity type and said jointing member, wherein a ratio of said joint area with respect to the area of said electrode between said anode electrodes of the second conductivity type and said joint member (joint area/electrode area) is 0.8 to 0.4.

8. The semiconductor laser device, as described in the claim 7, wherein an end portion of said joint member, which is connected with said anode electrodes of the second conductivity type, is in a convex/concave configuration.

9. The semiconductor laser device, as described in the claim 7, wherein said semiconductor layer has an even number of light emitting portions, which are disposed in one-dimensional manner within an inside thereof, and on said anode electrodes of the second conductivity type is formed a groove portion also between the light emitting portions neighboring to each other, as well as forming said groove portion between said supporting portion neighboring and said light emitting portion.

10. A semiconductor laser device, mounting a semiconductor laser element array of multi-beam structure on a sub-mount by a plural number of jointing members, said semiconductor laser element array of multi-beam structure comprising:

a semiconductor substrate;

a cathode electrode of a first conductivity type, which is formed on a first surface of said semiconductor substrate;

a semiconductor layer, which is formed on a second surface of said semiconductor substrate, which includes a plural number of light emitting portions including a first light emitting portion, each of the light emitting portions being adjacent each other, and which semiconductor layer includes a first terrace portion and a second terrace portion, said plural number of light emitting portions being provided between said first terrace portion and said second terrace portion, said first terrace portion being adjacent to said first light emitting portion;

a plural number of anode electrodes of a second conductivity type, which are formed above said plural number of light emitting portions and above said first and second terrace portions, respectively, and including a first anode electrode formed over said first light emitting portion and a second anode electrode formed over said first terrace portion; and an insulating film formed to cover an entire upper surface of said first and second terrace portions to prevent current flow through said first and second terrace portions, said sub-mount comprising a plural number of sub-mount electrodes formed on one surface of said sub-mount and including a first sub-mount electrode provided for said first and second anode electrodes, wherein said first and second anode electrodes are connected to said first sub-mount electrode through one of said plural number of jointing members, wherein said plural number of jointing members are comprised of a high thermal conductivity material, wherein one of said plural number of jointing is members formed as one piece to cover both said first anode electrode of said first light emitting portion and said second electrode of said first terrace portion, and wherein said first anode electrode and said second anode electrode are physically separated from each other to reduce shear stress generated within the plural number of light emitting portions.

11. The semiconductor laser device, as described in the claim 10, wherein an area of said first anode electrode is larger than a joint area between said first anode electrode and said one of plural number of jointing members.

12. The semiconductor laser device, as described in the claim 11, wherein a ratio of said joint area with respect to the area of said first anode electrode (joint area/electrode area) is 0.8 to 0.4.

13. The semiconductor laser device, as described in the claim 12, wherein an end portion of said plural number of jointing members, which are connected with said plural number of anode electrodes, are in a convex/concave configuration.

14. The semiconductor laser device, as described in the claim 10, wherein said plural number of light emitting portions are configured as an even number of light emitting portions, which are disposed in one-dimensional manner within an inside thereof, and wherein said plural number of anode electrodes are physically separated each other.

15. The semiconductor laser device according to claim 10, wherein said semiconductor substrate is comprised of one piece.

16. A semiconductor laser device, mounting a semiconductor laser element array of multi-beam structure on a sub-mount by a plural number of jointing members, said semiconductor laser element array of multi-beam structure comprising:

a semiconductor substrate;

a cathode electrode of a first conductivity type, which is formed on a first surface of said semiconductor substrate;

a semiconductor layer, which is formed on a second surface of said semiconductor substrate, and which semiconductor layer includes a plural number of light emitting portions including a first light emitting portion, each of the light emitting portions being adjacent each other, and which semiconductor layer includes a first terrace portion and a second terrace portion, said plural number of light emitting portions being provided between said first terrace portion and said second terrace portion, said first terrace portion being adjacent to said first light emitting portion;

a plural number of anode electrodes of a second conductivity type, which are formed above said plural number of light emitting portions and above said first and second terrace portions, respectively; and including a first anode electrode formed over said first light emitting portion and a second anode electrode formed over said first terrace portion; and an insulating film formed to cover an entire upper surface of said first and second terrace portions to prevent current flow through said first and second terrace portions, said sub-mount comprising a plural number of sub-mount electrodes formed on a one surface of said sub-mount and including a first sub-mount electrode provided for said first and second anode electrodes, wherein said first and second anode electrodes are connected to said first sub-mount electrode through one of said plural number of jointing members, wherein said plural number of jointing members are comprised of a high thermal conductivity material, wherein one of said plural number of jointing members is formed as one piece to cover both said first anode electrode of said first light emitting portion and second electrode of said first terrace portion, and wherein said first anode electrode and said second anode electrode are physically separated from each other to reduce shear stress generated within the plural number of light emitting portions, wherein an area of said first anode electrode is larger than a joint area between said first anode electrode and said one of plural number of jointing members, wherein a ratio of said joint area with respect to the area of said first electrode (joint area/electrode area) is 0.8 to 0.4.

17. The semiconductor laser device, as described in the claim 16, wherein an end portion of said one of plural number of jointing members, which is connected with said first anode electrode, is in a convex/concave configuration.

18. The semiconductor laser device, as described in the claim 16, wherein said plural number of light emitting portions are configured as an even number of light emitting portions, which are disposed in one-dimensional manner within an inside thereof, and wherein said plural number of anode electrodes are physically separated each other.

* * * * *